United States Patent
Yokoyama et al.

(10) Patent No.: US 8,057,902 B2
(45) Date of Patent: Nov. 15, 2011

(54) EPOXY PHOSPHOROUS-CONTAINING RESIN, EPOXY RESIN COMPOSITION ESSENTIALLY CONTAINING THE EPOXY RESIN, AND CURED PRODUCT OF THE EPOXY RESIN COMPOSITION

(75) Inventors: Naoki Yokoyama, Sodegaura (JP); Kazuo Ishihara, Sodegaura (JP); Tetsuya Nakanishi, Sodegaura (JP)

(73) Assignee: Nippon Steel Chemicals Co., Ltd., Tokyo (JP)

( * ) Notice: Subject to any disclaimer, the term of this patent is extended or adjusted under 35 U.S.C. 154(b) by 109 days.

(21) Appl. No.: 12/449,918

(22) PCT Filed: Mar. 4, 2008

(86) PCT No.: PCT/JP2008/054248
§ 371 (c)(1),
(2), (4) Date: Sep. 2, 2009

(87) PCT Pub. No.: WO2008/108485
PCT Pub. Date: Sep. 12, 2008

(65) Prior Publication Data
US 2010/0093928 A1    Apr. 15, 2010

(30) Foreign Application Priority Data
Mar. 5, 2007  (JP) ................................. 2007-054780

(51) Int. Cl.
B32B 27/38 (2006.01)
C08G 59/14 (2006.01)
C08G 65/335 (2006.01)
C08L 63/00 (2006.01)
(52) U.S. Cl. .......................... 428/413; 525/525; 528/108
(58) Field of Classification Search .................. 428/413; 523/435, 436; 525/525; 528/106, 108
See application file for complete search history.

(56) References Cited

U.S. PATENT DOCUMENTS 6,645,630 B1 * 11/2003 Nakamura et al. ............ 428/413
2003/0073781 A1 * 4/2003 Hwang et al. ................. 525/107
2009/0008127 A1 * 1/2009 Motobe et al. ................ 174/250

FOREIGN PATENT DOCUMENTS
WO    WO 2006059363 A1 *  6/2006
* cited by examiner

Primary Examiner — Michael J Feely
(74) Attorney, Agent, or Firm — Flynn, Thiel, Boutell & Tanis, P.C.

(57) ABSTRACT

A novel phosphorous-containing epoxy resin having a naphthalene skeleton is suitable as an insulating material, such as a copper-clad laminate used in an electronic circuit board, and a sealing material, molding material, casting material, adhesive or film material used in an electric component. Furthermore, this epoxy resin is suitable as a material for an electrically insulating coating.

8 Claims, 2 Drawing Sheets

EPOXY PHOSPHOROUS-CONTAINING RESIN, EPOXY RESIN COMPOSITION ESSENTIALLY CONTAINING THE EPOXY RESIN, AND CURED PRODUCT OF THE EPOXY RESIN COMPOSITION

FIELD OF THE INVENTION

The present invention relates to a novel epoxy phosphorus-containing resin, epoxy resin composition and cured product of the epoxy resin composition, which is useful for a resin composition for a copper-clad laminated board production used in an electronic circuit board or useful as sealing materials, molding materials, casting materials, adhesives or materials for electric insulation varnish used for electronic parts.

DESCRIPTION OF THE PRIOR ART

In general, an epoxy resin is widely used for electronic parts, electrical equipment, car parts, FRP or sports goods because it is excellent in adhesive property, heat resistance and molding ability. Especially, a copper-clad laminated board and a sealing material that are used in electronic parts or electric equipment are strongly required to have a safety such as prevention of a fire or retardation, therefore, brominated epoxy resins, which have these properties, are conventionally used. Although brominated epoxy resins have a problem in that the specific gravity of them is high, brominated epoxy resins are recognized as a useful electronic or electric material because a flame-retarding property can be provided by introducing a halogen, especially bromine, to an epoxy resin, and since an epoxy resin has an excellent reactivity, a good cured product can be easily obtained. However, recently, a requirement to have physical properties of being light, thin, short and small for electric goods is gradually becoming strong. Considering such a social requirement, halogenated epoxy resins whose specific gravity is high cannot be said to be a suitable material from the view point of the lightening requirement. Further, when halogenated epoxy resins are used for long terms at a high temperature, dissociation of the halide takes place and corrosion of the circuit is caused. Furthermore, since during burning-out treatment of used electronic parts or electric goods, harmful compositions such as halides are formed, the use of halogens is becoming a problem from a view point of environmental pollution, and investment for development of material which replaces halogenated resin is started. The inventors of this invention have earnestly challenged the problem, and invented a phosphorus-containing epoxy resin which satisfy the requirement to have physical properties of being light, thin, short and small and solve the problems of corrosion of circuit and formation of harmful compositions such as a halide (patent documents 1-2). However, further improvement for heat resistance of cured product or reduction of water-absorbing ratio is required.
Patent document 1: JPH11-166035 publication
Patent document 2: JPH11-279258 publication

DISCLOSURE OF THE INVENTION

The inventors of the present invention continued earnest studies to accomplish a further improvement in the heat resistance and reduction of water absorption ratio of a phosphorus-containing epoxy resin to which flame retardation is provided without using a halogen, and found out that the phosphorus-containing ratio can be reduced without spoiling the flame retarding property by the use of a novel phosphorus-containing epoxy resin to which a specific skeleton, that is, a naphthalene skeleton is introduced. By reducing the phosphorus content, a cured product characterized in having a high heat resistance and low water-absorption ratio can be obtained and accomplished the present invention. As a conventional method for the improvement of the heat resistance or water resistance, a method of introducing a naphthalene skeleton can be mentioned, however, the object of the present invention cannot be accomplished by naphthol novolac epoxy resins. A specific epoxy resin containing a naphthalene skeleton represented by general formula (7) can accomplish the object of the present invention. However, among specific epoxy resins that possesses naphthalene skeletons, there are compounds whose dissolving ability in a solvent is not good and deposit crystals, therefore, it is difficult to prepare a varnish during the preparation of a prepreg. Meanwhile, the novel epoxy resin of the present invention can improve the dissolving ability in a solvent remarkably by reacting an epoxy resin possessing a naphthalene skeleton with an organic phosphorous compound represented by general formula (8) and/or general formula (9), therefore, it becomes possible to prepare a prepreg by varnish characterized in not depositing crystals and is stabilized. The object of the present invention is to provide a novel phosphorous-containing epoxy resin, phosphorous-containing epoxy resin composition and cured product thereof which are suitable for use in a copper-clad laminated board used in an electronic circuit board and a sealing material, a molding material, an adhesive, a material for electric insulation coating and an electric insulation film.

That is, the essential point of the present invention is a novel phosphorous-containing epoxy resin, phosphorous-containing epoxy resin composition and cured product thereof containing a naphthalene skeleton represented by general formula (1).

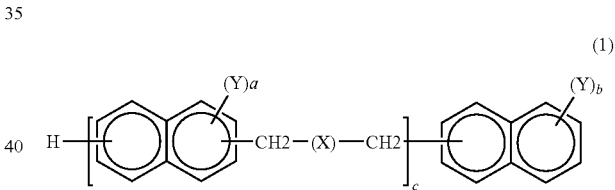

(1)

wherein,
a: 1, 2, 3, 4, 5, 6
b: 1, 2, 3, 4, 5, 6, 7
c: 0, 1, 2, 3, . . . .
X indicates benzene, naphthalene, anthracene, phenanthrene or biphenyl,
Y indicates general formulae (2)-(4), with at least one of general formula (3) or general formula (4) being present.

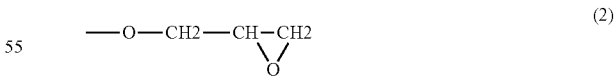

(2)

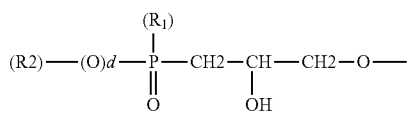

(3)

wherein,
d: 0 or 1
$R_1$ and $R_2$ indicate a hydrocarbon group and can be a normal chain, branch chain or cyclic structure. Or $R_1$ can bond with $R_2$ and can form a cyclic structure.

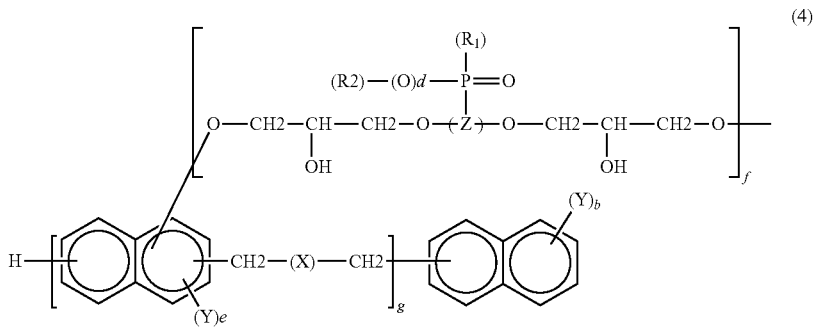

wherein,
e: 0, 1, 2, 3, 4, 5, 6
b: 1, 2, 3, 4, 5, 6, 7
g: 1, 2, 3, . . . .
d: 0 or 1
f: 1, 2, 3, 4, 5, 6
f+e≦6
$R_1$ and $R_2$ indicate a hydrocarbon group and can be a normal chain, branch chain or cyclic structure. Or $R_1$ can bond with $R_2$ and can form a cyclic structure.
X indicates benzene, naphthalene, anthracene, phenanthrene or biphenyl,
Y indicates general formulae (2)-(4),
Z indicates general formulae (5)-(6).

wherein,
h: 0, 1, 2, 2

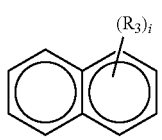

wherein,
i: 0, 1, 2, 3, 4, 5

$R_3$: indicates a hydrocarbon group and can be a normal chain, branch chain or cyclic structure.

Further, an essential point of the present invention is to use said novel flame-retardant phosphorous-containing epoxy resin, a phosphorous-containing epoxy resin composition and a cured product thereof as a resin composition for a copper-clad laminated board production used in an electronic circuit board and a sealing material, a molding material, an adhesive and material for electric insulation coating.

PREFERRED EMBODIMENT OF THE INVENTION

Figure 1:
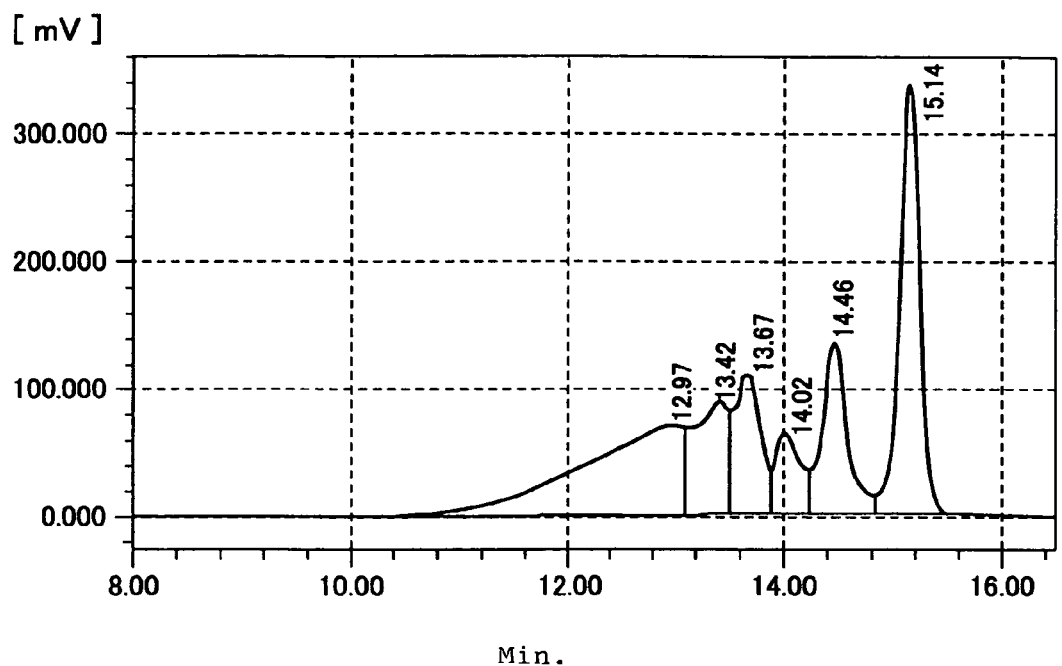
FIG. 1 shows a GPC chart of the epoxy resin obtained in Example 2.

The present invention will be illustrated more in detail.

A novel phosphorous-containing epoxy resin possessing a naphthalene, skeleton represented by general formula (1) can be obtained by reacting epoxy resin possessing naphthalene skeleton represented by general formula (7) with phosphorous compounds represented by general formula (8) and/or general formula (9).

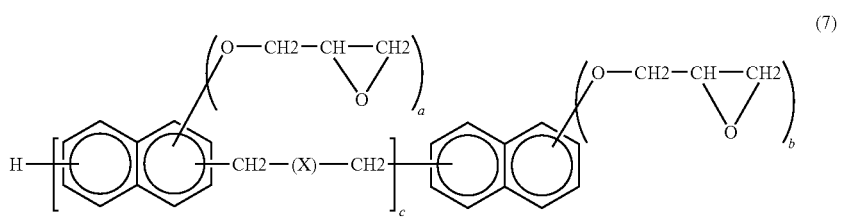

$R_3$: indicates a hydrocarbon group and can be a normal chain, branch chain or cyclic structure.

wHerein,
a: 1, 2, 3, 4, 5, 6
b: 1, 2, 3, 4, 5, 6, 7
c: 0, 1, 2, 3, . . . .
X indicates benzene, naphthalene, anthracene, phenanthrene or biphenyl.

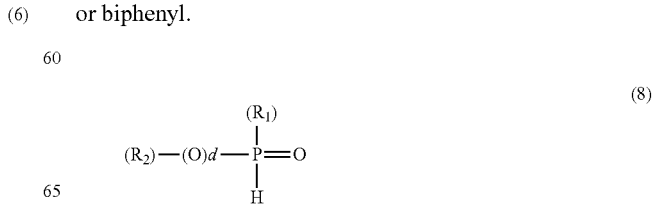

wherein,
d: 0 or 1
$R_1$ and $R_2$ indicate a hydrocarbon group and can be a normal chain, branch chain or cyclic structure. Or $R_1$ can bond with $R_2$ and can form a cyclic structure.

(9)

wherein,
d: 0 or 1
$R_1$ and $R_2$ indicate a hydrocarbon group and can be a normal chain, a branch chain or a cyclic structure. Or $R_1$ can bond with $R_2$ and can form a cyclic structure.
Z indicates general formulae (5)-(6).

As an epoxy resin represented by general formula (7), epoxy resins disclosed in JPH03-000717 publication, JPH03-090075 publication, JP2006-160868 publication or JP2004-123859 publication can be mentioned, for example, ESN-155, ESN-185V and ESN-175 of ESN-100 series (product of Tohto Kasei, β-naphthol-aralkyl epoxy resins), ESN-355 and ESN-375 of ESN-300 series (product of Tohto Kasei, dinaphthol-aralkyl epoxy resins), ESN-475V and ESN-485 of ESN-400 series (product of Tohto Kasei, α-naphthol-aralkyl epoxy resins) can be mentioned, however, not intended to be restricted to these compounds, and can be used in combinations thereof. Further, other epoxy resins can be used in an amount that do not influence the physical properties.

Organic phosphorous compounds to be used in the present invention represented by general formula (8) are organic phosphorous compounds characterized that an active hydrogen which can react with quinines or a functional group, such as a glycidyl group or vinyl group, is bonded with a phosphorus atom, specifically, HCA (product of Sanko Co., Ltd., 9,10-dihydro-9-oxa-10-phosphaphenanthrene-10-oxide), diphenylphosphine oxide or CPHO (product of Nippon Chemical Industrial Co., Ltd., cyclooctylenephosphineoxide) can be mentioned. Organic phosphorous compounds to be used in the present invention represented by general formula (9) is a phosphorous-containing phenolic compound obtained by reacting an active hydrogen of phosphorous compounds represented by general formula (8) with quinones, specifically, HCA-HQ (product of Sanko Co., Ltd., 10-(2,5-dihydroxyphenyl)-dihydro-9-oxa-10-phosphaphenanthrene-10-oxide), -(2,7-dihydroxynaphthyl)-10-dihydro-9-oxa-10-phosphaphenanthrene-10-oxide, PPQ (product of Hokko Chemical Industry Co., Ltd., diphenylphosphinyl hydroquinone), diphenylphosphinylnaphthoquinone, CPHO-HQ (product of Nippon Chemical Industrial C0., Ltd., cyclooctylene phosphinyl-1,4-benzenediol) or cyclooctylenephosphinyl-1,4-naphthalenediol can be mentioned. In the present invention, any kind of product represented by general formula (8) and/or general formula (9) can be used, and not intended to be restricted to these compounds and these compounds can be used in combinations thereof.

Phosphorous-containing phenolic compounds represented by general formula (9) can be obtained by methods disclosed in JPH5-214068 publication, Zh. Obshch. Khim. 42(11), pp 2415-2418 (Russian general magazine), JPS60-126293 publication, JPS61-236787 publication or JPH5-331179 publication. During the preparation, operations such as purification or recrystallization are necessary to pick up the formed multi-functional phosphorus-containing phenolic compound alone. However, if organic phosphorous compounds characterized in that an active hydrogen is bonded with a phosphorus atom, which is a compound represented by general formula (8), properly remains, not only such operations become not necessary, but also it becomes possible to lower the epoxy resin viscosity after the reaction by increasing the phosphorous content in the resin.

The reaction of a naphthalene skeleton containing epoxy resin represented by general formula (7) with a phosphorus compound represented by general formula (8) and/or general formula (9) can be carried out by a publicly known method and can be progressed by a 100-200° C. desirably 120-180° C. reaction temperature under a constant stirring condition.

The reaction time can be decided b measuring the epoxy equivalent. Epoxy equivalent can be measured by a method regulated in JIS K7236. By the reaction of a naphthalene skeleton-containing epoxy resin represented by general formula (7) with a phosphorus compound represented by general formula (8) and/or general formula (9), the epoxy equivalent becomes larger and the end point of the reaction can be decided by a comparison with the theoretical epoxy equivalent.

In a case when the reaction rate is too slow, it is possible to improve the productivity by the use of a catalyst, if necessary. Specifically, various kinds of catalysts, for example tertiary amines such as benzyldimethyl amine, quaternary ammonium salts such as tetramethylammonium chloride, phosphines such as triphenyl phosphine, or tris(2,6-dimethoxyphenyl) phosphine, phosphonium salts such as ethyltriphenylphosphoniumbromide, imidazoles such as 2-methylimidazole or 2-ethyl-4-methylimidazole can be used.

As a curing agent to be used for a composition of the present invention, any kind of conventional curing agent for an epoxy resin can be used. For example, various multivalent phenolic resins such as phenol novolac resins, acid anhydrides, amines represented by DICY, hydrazides or acidic polyesters can be mentioned, and these curing agents can be used alone or in combinations thereof.

To the composition of the present invention, a curing accelerator such as a tertiary amine, quaternary ammonium salt, phosphines or imidazoles can be blended if necessary. Further, if necessary, a reinforcing agent such as an inorganic filler or glass cloth-aramid fiber, filler or pigment can be blended.

Evaluation tests of the properties of the laminated boards obtained by use of the novel phosphorus-containing epoxy resin has been made. According to the evaluation results, it becomes clear that an epoxy resin composition and cured product thereof characterized in having a high heat-resistance, lower water-absorbing ratio and a flame-retarding property not containing a halide can be obtained. Said epoxy resin, epoxy resin composition and cured product thereof is understood to be useful as a resin composition for copper-clad laminated board production used in an electronic circuit board and a sealing material, a molding material, an adhesive and a material for electric insulation coating.

EXAMPLES

The present invention will be illustrated more in detail according to the Examples and Comparative Examples, however, it is not intended to limit the scope of the claims of the present invention to the Examples. A laminated board is prepared by the conditions mentioned below. An obtained epoxy resin, a curing agent and a curing accelerator, if necessary, are dissolved in a solution and impregnated with a glass cloth. The solution is removed by a drying process and a prepreg obtained. Four sheets of the prepreg and copper foil are laminated and heat pressed, then a cured laminated board is obtained. The flame-retarding property is measured according to UL (Underwriter Laboratories) standards. The copper foil peeling strength is measured according to JIS C 6481 5.7 standards. The glass transition point is measured by Exster 6000 DSC, which is a product of SII Nano Technology Inc. The water-absorbing ratio is measured as follows. The specimen is set at a condition of 85° C.×85% humidity for 500 hours. The initial weight and weight after 500 hours were measured and the increased weight ratio is calculated and water-absorbing ratio was obtained.

Example 1

In a four necks glass separable flask provided with a stirrer, thermometer, condenser and nitrogen gas-introducing device, 56.1 weight parts of HCA and 131 weight parts of toluene were poured and dissolved by heating. Then, 39.0 weight parts of 1,4-naphthoquinone was added divisionally paying attention to the temperature heated by the reaction heat. At this point, the molar ratio of 1,4-naphthoquinone and HCA is 1,4-naphthoquinone/HCA=0.95. After the reaction, 254.5 weight parts of ESN-485 was added and stirred by introducing nitrogen gas and heated to 130° C. so as to remove toluene. 0.1 weight parts of triphenylphosphine was added and reacted at 160° C. for 4 hours. The epoxy equivalent of the obtained epoxy resin was 349.6 g/eq, the phosphorus content was 0.80 weight %. A curing agent (DICY) and curing accelerator (2E4MZ) were added to the obtained epoxy resin by the ratio indicated in Table 1, and evaluation of the laminated board was carried out by the aforementioned method. The results are shown in Table 1.

Example 2

Figure 2:
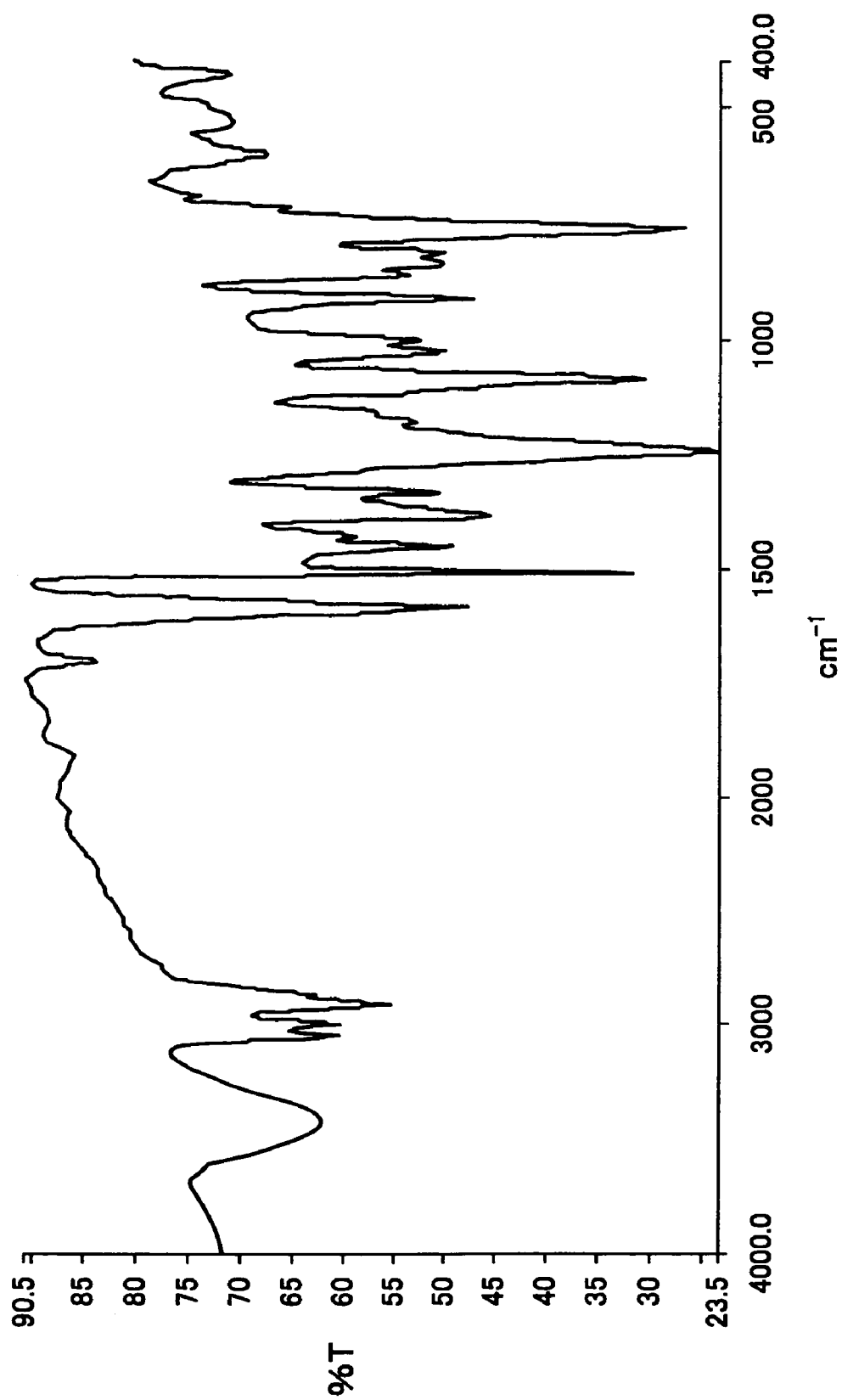
FIG. 2 shows a FTIR chart of the epoxy resin obtained in Example 2.

The same operations as Example 1 were carried out except for using 84.5 weight parts of HCA, 51.7 weight parts of 1,4-naphthoquinone, 127 weight parts of toluene, 663.0 weight parts of ESN-485, 0.1 weight parts of triphenyl phosphine and blending 200.8 weight parts of EPPN-501H (product of Nippon Kayaku Co., Ltd., three functional epoxy resin) with ESN-485. The molar ratio of 1,4-naphthoquinone/HCA=0.83. The epoxy equivalent of the obtained epoxy resin was 346.7 g/eq and the phosphorus content was 1.2 weight %. The GPC chart and FTIR chart of the obtained epoxy resin are shown in FIGS. 1 and 2. A curing agent (DICY) and curing accelerator (2E4MZ) were added to the obtained epoxy resin in the ratio indicated in Table 1, and the evaluation of the laminated board was carried out according to the aforementioned method. The results are shown in Table 1.

Example 3

The same operations as Example 1 were carried out except for using 70.1 weight parts of HCA, 46.2 weight parts of 1,4-naphthoquinone, 235 weight parts of xylene, 209.8 weight parts of ESN-155 instead of ESN-485 and 0.1 weight parts of triphenyl phosphine. The molar ratio of 1,4-naphthoquinone/HCA=0.900. The epoxy equivalent of the obtained epoxy resin is 326.1 g/eq and the phosphorus content was 1.0 weight %. A curing agent (DICY) and curing accelerator (2E4MZ) were added to the obtained epoxy resin in the ratio indicated in Table 1, and the evaluation of the laminated board was carried out according to the aforementioned method. The results are shown in Table 1.

Example 4

The same operations as Example 1 were carried out except for using 9.0 weight parts of HCA, 70.0 weight parts of HCA-HQ instead of 1,4-naphthoquinone, 721.0 weight parts of ESN-155 instead of ESN-485 and blending 200.0 weight parts of ESN-375. The epoxy equivalent of the obtained epoxy resin was 274.9 g/eq and the phosphorus content was 0.8 weight %. A curing agent (DICY) and curing accelerator (2E4MZ) were added to the obtained epoxy resin by the ratio indicated in Table 1, and the evaluation of the laminated board is carried out according to the aforementioned method. The results are shown in Table 1.

Comparative Example 1

The same operations as Example 1 were carried out except using 127.0 weight parts of HCA, 62.1 weight parts of bisphenol A (product of Nippon Steel Chemical Co., Ltd.), 810.9 weight parts of YDPN-638 (product of Tohto Kasei Co., Ltd., phenol novolac epoxy resins) and 0.2 weight parts of triphenyl phosphine. The epoxy equivalent of the obtained epoxy resin was 298.6 g/eq and the phosphorus content was 1.8 weight %. A curing agent (DICY) and curing accelerator (2E4MZ) were added to the obtained epoxy resin in the ratio indicated in Table 1, and the evaluation of the laminated board was carried out according to the aforementioned method. The results are shown in Table 1.

Comparative Example 2

The same operations as Example 1 were carried out except for using 70.5 weight parts of HCA, 64.7 weight parts of bisphenol A, 864.8 weight parts of YDCN-701 (product of Tohto Kasei Co., Ltd., cresol novolac epoxy resins) and 0.1 weight parts of triphenyl phosphine. The molar ratio of 1,4-naphthoquinone/HCA=0.93. The epoxy equivalent of the obtained epoxy resin was 293.7 g/eq and the phosphorus content was 1.0 weight %. A curing agent (DICY) and curing accelerator (2E4MZ) were added to the obtained epoxy resin in the ratio indicated in Table 1, and an evaluation of laminated board was carried out according to the aforementioned method. The results are shown in Table 1.

Comparative Example 3

The same operations as Example 1 were carried out except for using 56.1 weight parts of HCA, 37.0 weight parts of 1,4-naphthoquinone, 235 weight parts of xylene, 906.9 weight parts of ZX-1142L (product of Tohto Kasei Co., Ltd., or α-naphthol novolac epoxy resins) instead of ESN-485, and 0.1 weight parts of triphenyl phosphine. The molar ratio is 1,4-naphthoquinone/HCA=0.90. The epoxy equivalent of the obtained epoxy resin was 298.9 g/eq and the phosphorus content was 0.8 weight %. A curing agent (DICY) and curing accelerator (2E4MZ) were added to the obtained epoxy resin in the ratio indicated in Table 1, and the evaluation of the laminated board was carried out according to the aforementioned method. The results are shown in Table 1.

Comparative Example 4

The same operations as Example 1 were carried out except for using 141.0 weight parts of HCA, 77.4 weight parts of 1,4-naphthoquinone, 329 weight parts of toluene, 631.6 weight parts of YDPN-638 instead of ESN-485, and 150.0 weight parts YDF-170 and 0.2 weight parts of triphenyl phosphine. Molar ratio is 1,4-naphthoquinone/HCA=0.75. The epoxy equivalent of the obtained epoxy resin was 306.4 g/eq and the phosphorus content was 2.0 weight %. A curing agent (DICY) and curing accelerator (2E4MZ) were added to the obtained epoxy resin in the ratio indicated in Table 1, and the evaluation of the laminated board was carried out according to the aforementioned method. The results are shown in Table 1.

Comparative Example 5

The same operations as Example 1 were carried out except for using 70.4 weight parts of HCA, 13.3 weight parts of 1,4-naphthoquinone, 164 weight parts of toluene, 249.6 weight parts of YDPN-638 instead of ESN-485 and 0.2 weight parts of triphenyl phosphine. The molar ratio of 1,4-naphthoquinone/HCA=0.25. The epoxy equivalent of the obtained epoxy resin was 287.1 g/eq and the phosphorus content was 3.0 weight %. 33.3 weight parts of the obtained epoxy resin and 66.7 weight parts of ESN-485 were blended and the evaluation of the laminated board was carried out. The results of the evaluation of the laminated board are shown in Table 1.

The phosphorus content of the novel epoxy resin synthesized by the technique of the present invention is 0.8% and has a good flame-retarding property, and can provide a cured product having a good heat resistance and low water-absorbing ratio. Thus, a novel phosphorous-containing epoxy resin and novel phosphorous-containing epoxy resin composition having a good flame-retarding property by a lower phosphorous content and, further, is excellent in heat resistance, adhesive property and water-absorbing ratio and, therefore, is suitable as an electric insulation material, such as a copper-clad laminated board used for an electro circuit board, and a sealing material, a molding material, an adhesive and a material for film and, further, is useful as a material for electric insulation coating.

INDUSTRIAL APPLICABILITY

A novel phosphorus-containing epoxy resin and novel phosphorous-containing epoxy resin composition have a good flame-retarding property and a lower phosphorous content and, further, are excellent in heat resistance, adhesive property and water-absorbing ratio and, therefore, are suited for an electric insulation material, such as a copper-clad laminated board used for an electro circuit board, and a sealing material, a molding material, an adhesive and a material for film and, further, is suited as a material for electric insulation coating.

TABLE 1

|  | Exp. 1 | Exp. 2 | Exp. 3 | Exp. 4 | Comp. Exp. 1 | Comp. Exp. 2 | Comp. Exp. 3 | Comp. Exp. 4 | Comp. Exp. 5 |
|---|---|---|---|---|---|---|---|---|---|
| HCA | 56.1 | 84.5 | 70.1 | 9.0 | 127.0 | 70.5 | 56.1 | 141.0 | 70.4 |
| HCA-HQ |  |  |  | 70.0 |  |  |  |  |  |
| 1,4naphthoquinone | 39.0 | 51.7 | 46.2 |  |  |  | 37.0 | 77.4 | 13.3 |
| ESN-485 | 254.5 | 663.0 |  |  |  |  |  |  | 666.7 |
| ESN-155 |  |  | 209.8 | 721.0 |  |  |  |  |  |
| ESN-375 |  |  |  | 200.0 |  |  |  |  |  |
| BPA (bisphenol A) |  |  |  |  | 62.1 | 64.7 |  |  |  |
| YDPN-638 |  |  |  |  | 810.9 |  |  | 631.6 | 249.6 |
| YDCN-701 |  |  |  |  |  | 864.8 |  |  |  |
| ZX-1142L |  |  |  |  |  |  | 906.9 |  |  |
| YDF-170 |  |  |  |  |  |  |  | 150.0 |  |
| EPPN-501HY |  | 200.8 |  |  |  |  |  |  |  |
| triphenyl phosphine | 0.1 | 0.1 | 0.1 | 0.1 | 0.2 | 0.1 | 0.1 | 0.2 | 0.2 |
| epoxy equivalent (g/eq) | 349.6 | 346.7 | 326.1 | 274.9 | 298.6 | 293.7 | 298.9 | 306.4 | 287.1 |
| phosphorus content (%) | 0.8 | 1.2 | 1.0 | 0.8 | 1.8 | 1.0 | 0.8 | 2.0 | 3.0 |
| synthesized epoxy resin | 100.00 | 100.00 | 100.00 | 100.00 | 100.00 | 100.00 | 100.00 | 100.00 | 33.33 |
| ESN-485 |  |  |  |  |  |  |  |  | 66.67 |
| DICY | 3.00 | 3.03 | 3.22 | 3.82 | 3.52 | 3.58 | 3.51 | 3.43 | 3.66 |
| 2E4MZ | 0.45 | 0.40 | 0.47 | 0.35 | 0.03 | 0.01 | 0.02 | 0.01 | 0.60 |
| flame retarding property | V-0 | V-0 | V-0 | V-0 | V-0 | V-1 | V-1 | V-0 | V-1 |
| average combustion time (sec) | 8 | 5 | 8 | 9 | 6 | 18 | 24 | 8 | 12 |
| glass transition point (° C.) | 175.2 | 171.8 | 151.4 | 172.5 | 129.4 | 142.1 | 170.2 | 144.2 | 148.1 |
| copper foil peeling strength (Kgf/cm) | 1.22 | 1.46 | 1.44 | 1.40 | 1.49 | 1.40 | 0.95 | 1.47 | 1.40 |
| layer adhesive strength (Kgf/cm) | 1.00 | 1.00 | 1.08 | 1.10 | 0.85 | 0.68 | 0.44 | 0.91 | 0.92 |
| water absorbing ratio (%) | 1.0 | 1.1 | 1.0 | 1.2 | 2.0 | 1.6 | 1.2 | 1.8 | 1.4 |

According to the above-mentioned results of the Examples and Comparative Examples, it is clearly understood from the physical properties mentioned in Comparative Examples of Table 1, that in a case of phosphorus-containing novolac epoxy resins, a good flame retardancy cannot be obtained when the phosphorus content is 1%. When the phosphorus content is increased to 2% to improve the flame retardancy as shown in Comparative Example 4, the water-absorbing ratio is not good. Meanwhile, in the case of Comparative Example 3, which introduces a naphthalene skeleton, phosphorous-containing naphthol novolac epoxy resins cannot accomplish a good flame-retarding property by a phosphorus content of 0.8%. By blending phosphorous-containing naphthol novolac epoxy resins with naphthol aralkyl epoxy resin, good effects cannot be obtained in the flame-retarding property heat resistance and water-absorbing ratio.

The invention claimed is:

1. A phosphorus-containing epoxy resin containing a naphthol-aralkyl skeleton represented by general formula (1),

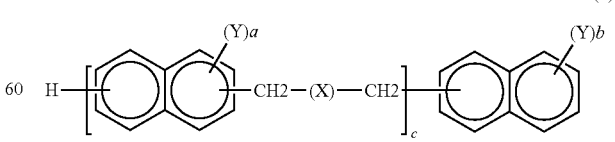

(1)

wherein
a is an integer of 1, 2, 3, 4, 5 or 6,
b is an integer of 1, 2, 3, 4, 5, 6 or 7,
c is an integer of 1 or more, X is benzene, naphthalene, anthracene, phenanthrene or biphenyl, Y is at least one of general formulae (2)-(4), with at least one of general formula (3) or general formula (4) being present,

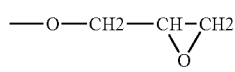
(2)

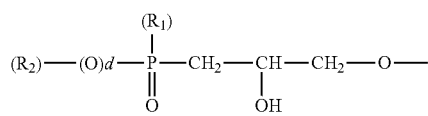
(3)

wherein d is 0 or 1

$R_1$ and $R_2$ independently are a hydrocarbon group and can be a normal chain, branch chain or cyclic structure, or $R_1$ can be bonded with $R_2$ and form a cyclic structure,

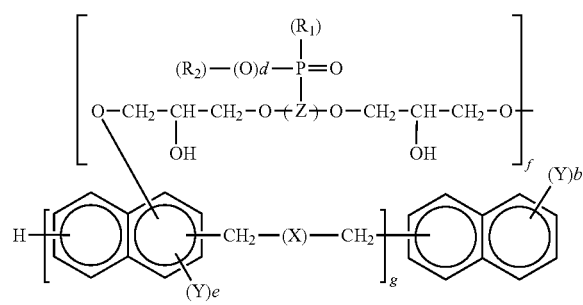
(4)

wherein e is 0 or an integer of 1, 2, 3, 4 or 5, b is an integer of 1, 2, 3, 4, 5, 6 or 7, g is an integer of 1 or more, d is 0 or 1, f is an integer of 1, 2, 3, 4, 5 or 6, the sum total of f and e is an integer of 1, 2, 3, 4, 5 or 6, $R_1$ and $R_2$ are independently a hydrocarbon group and can be a normal chain, branch chain or cyclic structure or $R_1$ can be bonded with $R_2$ and can form a cyclic structure, X is benzene, naphthalene, anthracene, phenanthrene or biphenyl, Y is at least one of general formulae (2)-(4), Z is at least one of general formulae (5) and (6),

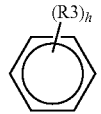
(5)

wherein h is 0, 1, 2 or 3, $R_3$ is a hydrocarbon group and can be a normal chain, branch chain or cyclic structure,

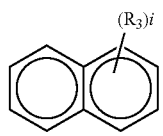
(6)

wherein i is 0, 1, 2, 3, 4 or 5, and $R_3$ is a hydrocarbon group and can be a normal chain, branch chain or cyclic structure.

2. The phosphorus-containing epoxy resin of claim 1, obtained by reacting an epoxy resin possessing a naphthol-aralkyl skeleton, which essentially contains an epoxy resin of general formula (7), with a phosphorous compound represented by general formula (8) and/or general formula (9),

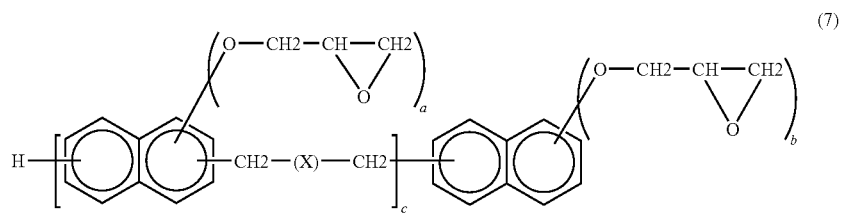
(7)

a is an integer of 1, 2, 3, 4, 5 or 6, b is an integer of 1, 2, 3, 4, 5, 6 or 7, c is an integer of 1 or more, X is benzene, naphthalene, anthracene, phenanthrene or biphenyl,

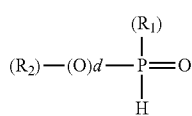
(8)

wherein d is 0 or 1,

R$_1$ and R$_2$ independently are a hydrocarbon group and can be a normal chain, branch chain or cyclic structure, or R$_1$ can be bonded to R$_2$ and can form a cyclic structure,

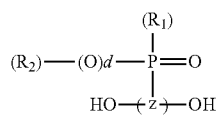
(9)

wherein d is 0 or 1,

R$_1$ and R$_2$ independently are a hydrocarbon group and can be a normal chain, branch chain or cyclic structure, or R$_1$ can be bonded to R$_2$ and can form a cyclic structure, and Z is at least one of general formulae (5) and (6).

3. The phosphorus-containing epoxy resin of claim 2, where a is 1 and b is claim 1.

4. A phosphorus-containing epoxy resin composition obtained by blending a curing agent with the phosphorus-containing epoxy resin of claim 1.

5. A laminated board formed from the phosphorus-containing epoxy resin composition of claim 4.

6. A sealing material formed from the phosphorus-containing epoxy resin composition of claim 4.

7. A molding material formed from the phosphorus-containing epoxy resin composition of claim 4.

8. A cured product obtained by curing the phosphorus-containing epoxy resin composition according to claim 4.

* * * * *